(12) United States Patent
Saeki

(10) Patent No.: US 6,717,252 B2
(45) Date of Patent: Apr. 6, 2004

(54) SEMICONDUCTOR DEVICE

(75) Inventor: Yoshihiro Saeki, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/235,508

(22) Filed: Sep. 6, 2002

(65) Prior Publication Data

US 2003/0122237 A1 Jul. 3, 2003

(30) Foreign Application Priority Data

Dec. 28, 2001 (JP) ........................................ 2001-399728

(51) Int. Cl.[7] ............................................. H01L 23/02
(52) U.S. Cl. ...................... 257/686; 257/777; 257/690; 257/678
(58) Field of Search ................................ 257/686, 734, 257/687–690, 777–790, 678

(56) References Cited

U.S. PATENT DOCUMENTS

| | | | | |
|---|---|---|---|---|
| 2002/0004258 A1 | * | 1/2002 | Nakayama et al. | 438/107 |
| 2002/0089050 A1 | * | 7/2002 | Michii et al. | 257/686 |
| 2002/0096755 A1 | * | 7/2002 | Fukui et al. | 257/686 |
| 2003/0006495 A1 | * | 1/2003 | Akram | 257/686 |
| 2003/0057539 A1 | * | 3/2003 | Koopmans | 257/686 |

* cited by examiner

*Primary Examiner*—Long Pham
*Assistant Examiner*—Nathan W. Ha
(74) *Attorney, Agent, or Firm*—Volentine Francos, PLLC

(57) ABSTRACT

A semiconductor device has a first chip fixed and connected to a substrate, wherein the first chip includes redistributions sealed with a sealing resin and for connecting between an integrated circuit formed on the surface of a semiconductor chip and ball pads, and solder bumps for connection to the substrate, which are respectively mounted on the ball pads.

20 Claims, 2 Drawing Sheets

SEMICONDUCTOR DEVICE

BACKGROUND OF THE INVENTION

1. Field of the Invention

The present invention relates to a semiconductor device of an MCP (Multi-Chip Package) structure, which has a plurality of semiconductor chips.

This application relies for priority on Japanese patent application, Serial Number 399728/2001, filed Dec. 28, 2001, which is incorporated herein by reference in its entirety.

2. Description of the Related Art

FIG. 1 is a cross-sectional view showing a structure of a conventional semiconductor device having an MCP structure.

The semiconductor device has a first chip 10 and a second chip 20 and is one of an MCP type wherein these are mounted over a substrate 30 so as to overlap each other and the surfaces thereof are sealed up with a resin.

The first chip 10 comprises bumps 13 made of gold and a semiconductor substrate 11 having a surface, i.e., a circuit forming surface. The bumps 13 are formed on corresponding bonding pads 12 provided on the surface of the semiconductor substrate 11. The second chip 20 includes a semiconductor substrate 21 having a surface, i.e., a circuit forming surface. Bonding pads 22 are provided on the surface of the semiconductor substrate 21.

The substrate 30 comprises an insulating base member 31. The substrate 30 mounts the first chip 10 and the second chip 20 thereon and electrically and mechanically connects them to a printed wiring board or the like. In such a substrate 30, bonding pads 32 are formed on a chip mounting surface of the insulating base member 31, and ball pads 33 are formed on an external connecting surface thereof. The bonding pads 32 and the ball pads 33 are formed so as to oppose each other with the base member 31 interposed therebetween, and conductive via posts 34 electrically connect between these. Further, solder bumps 35 for connection to the printed wiring board or the like are respectively formed on the ball pads 33.

The first chip 10 is flip-chip connected to the substrate 30. Namely, a circuit forming surface of the first chip 10 is mounted over a chip mounting surface of the substrate 30 so as to face each other. The bonding pads 32 on the substrate 30 and the bonding pads 12 on the first chip 10 are respectively electrically connected to one another by means of the bumps 13. Further, the substrate 30 and the first chip 10 are fixed with an anisotropic conductive or non-conductive adhesive 41.

The back or reverse surface of the second chip 20 is fixed to the back surface of the first chip 10 with an adhesive 42. The bonding pads 22 provided on the front surface of the second chip 20, and the bonding pads 32 on the substrate 30 are respectively connected to one another by wires 43 such as gold wires by using a wire bonding technology. The balls 23 which are formed in a process for wire bonding are respectively formed on the bonding pads 22. The first chip 10, the second chip 20 and the wires 43 or the like are sealed up with a sealing resin 44 and thus these are protected from external environments.

However, in the process for fabricating of the conventional semiconductor device, the anisotropic conductive or non-conductive adhesive 41 is used to fix the first chip 10 to the substrate 30. Therefore, the following problems have arisen.

Namely, a problem arises in that since the adhesive 41 is normally hygroscopic, it easily absorbs moisture in a process for fabricating a package or under use environments of the package subsequent to the completion of its manufacture, thereby making it easy to peel off. A further problem arises in that when such a semiconductor device is mounted on a printed wiring board or the like and connected thereto by reflow, the moisture absorbed by the adhesive 41 is vaporized by heat of the reflow, thereby causing an explosion, whereby the semiconductor device is damaged and an electrical connection between the substrate 30 and the first chip 10 is broken.

Consequently, a semiconductor device of an MCP structure having an improved moisture resistance and reflow resistance has been demanded.

SUMMARY OF THE INVENTION

According to one aspect of the present invention, there is provided a semiconductor device which includes a package substrate which has first and second major surfaces and which has first and second electrode pads formed on the first major surface, and which has first external terminals formed on the second major surface and electrically connected to the corresponding first and second electrode pads.

The semiconductor device further includes a first semiconductor chip which has third and fourth major surfaces and which has third electrode pads formed on the third major surface and which has second external terminals and which has conductive members electrically connected to the corresponding second external terminals and the third electrode pads, and which has a first sealing resin sealing the third major surface and the conductive members except contact portions between the second external terminals and the conductive members, the second external terminals being connected to the corresponding first electrode pads.

The semiconductor device also includes a second semiconductor chip which has a fifth major surface mounted over the fourth major surface and a sixth major surface and which has fourth electrode pads formed on the sixth major surface and bonding wires which connect the fourth electrode pads and the second electrode pads, and a second sealing resin which seals the bonding wires and the second electrode pads, and the first and second semiconductor chips.

The above and further objects and novel features of the invention will more fully appear from the following detailed description, appended claims and the accompanying drawings.

DETAILED DESCRIPTION OF THE PREFERRED EMBODIMENTS

Figure 1:
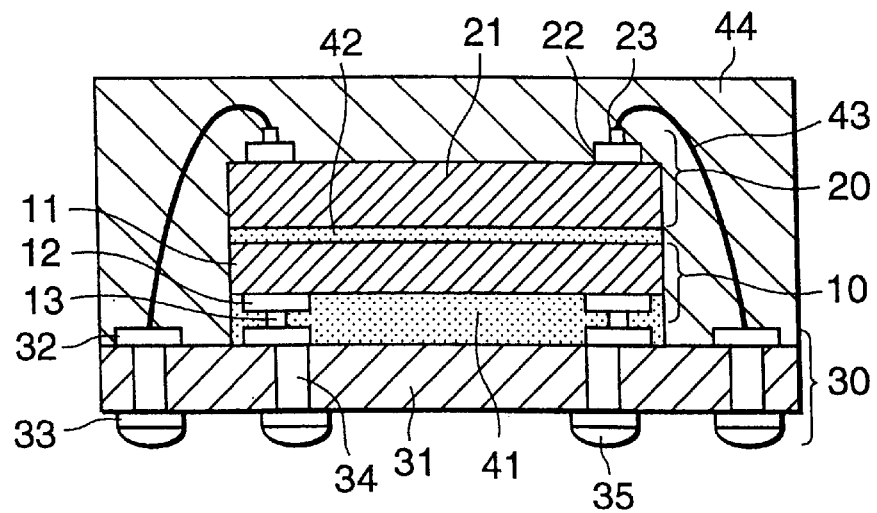
FIG. 1 is a cross-sectional view showing a conventional semiconductor device.

An semiconductor device according to preferred embodiments of the present invention will be explained hereinafter with reference to figures. In order to simplify explanation, like elements are given like or corresponding reference numerals through this specification and figures. Dual explanations of the same elements are avoided.

First Preferred Embodiment

Figure 2:
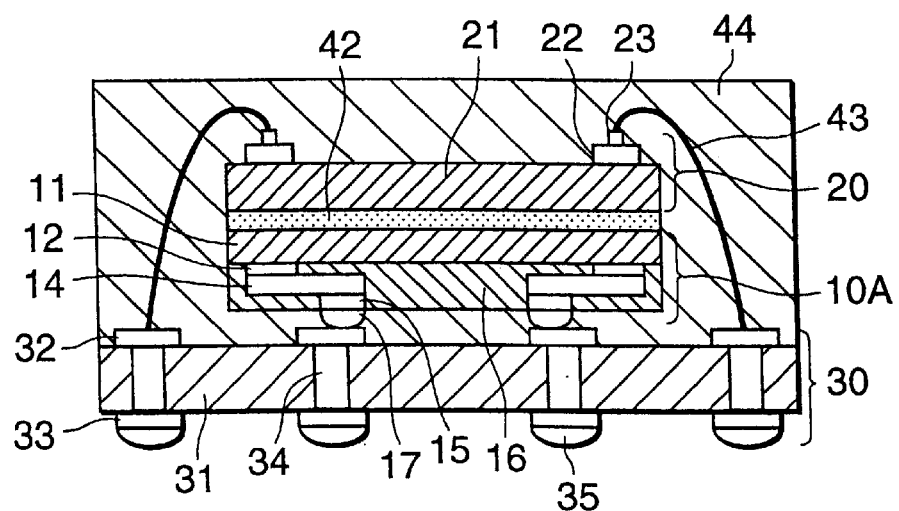
FIG. 2 is a cross-sectional view showing a semiconductor device according to a first preferred embodiment of the present invention.

FIG. 2 is a cross-sectional view showing a semiconductor device according to a first preferred embodiment of the present invention.

The semiconductor device has a first chip 10A and a second chip 20 which are mounted over a substrate 30 so as to overlap each other and is called an MCP type semiconductor device. The surface of the semiconductor device is sealed up with a resin.

The first chip 10A is a WCSP (Wafer-level Chip Size Package) which has a function as a package per se. The first chip 10A is different from the second chip 20 in that the second chip 20 does not have a function as a package per se. The first chip 10A has bonding pads 12 formed of aluminum containing silicon, which are provided on the surface, i.e., circuit forming surface of a semiconductor substrate 11 formed of silicon. Ball pads 15 (also referred to as "copper posts") comprised of copper are connected to their corresponding bonding pads 12 with copper-made redistributions 14 interposed therebetween. The redistributions 14 are wirings for displacing the positions of the ball pads 15 (or solder bumps 17) from the bonding pads 12 to connect the first chip 10A to terminals outside the first chip 10A and relocating them in suitable positions.

The circuit forming surface of the semiconductor substrate 11, the bonding pads 12 and the redistributions 14 are respectively sealed up with an sealing resin 16 such as epoxy or polyimide so as to cover these and expose the top surfaces of the ball pads 15. Further, solder bumps 17 are respectively formed on the exposed top surfaces of ball pads 15.

The second chip 20 has bonding pads 22 formed on a circuit forming surface of a semiconductor substrate 21 formed of silicon.

The substrate 30 comprises an insulating base member 31 such as a glass fiber. The substrate 30 mounts the first chip 10A and the second chip 20 thereon and electrically and mechanically connects them to a printed wiring board or the like. In such a substrate 30, gold-made bonding pads 32 are formed on a chip mounting surface (a first major surface) of the insulating base member 31, and copper-made ball pads 33 are formed on an external connecting surface (a second major surface) thereof. The bonding pads 32 and the ball pads 33 are formed so as to oppose each other with the base member 31 interposed therebetween, and conductive via posts 34 such as copper or aluminum electrically connect between these. Further, solder bumps 35 for connection to the printed wiring board or the like are respectively formed on the ball pads 33.

The first chip 10A is flip-chip connected to the substrate 30. Namely, a circuit forming surface (a first major surface) of the first chip 10A is mounted over the chip mounting surface of the substrate 30 so as to face each other. The bonding pads 32 on the substrate 30 and the solder bumps 17 on the ball pads 15 are respectively electrically connected to one another.

The back or reverse surface (a second major surface) of the second chip 20 is fixed to the back surface (a second major surface) of the, first chip 10A with an adhesive 42. The bonding pads 22 provided on the front surface (a first surface) of the second chip 20, and the bonding pads 32 on the substrate 30 are respectively connected to one another by wires 43 such as gold-made wires by using a wire bonding technology. Gold-made balls 23 which are formed in a process for wire bonding are respectively formed on the bonding pads 22. The first chip 10A, the second chip 20 and the wires 43 or the like are sealed up with a sealing resin 44 and thus these are protected from external environments.

A schematic process for fabricating the semiconductor device will next be described.

The first chip 10A, the second chip 20 and the substrate 30 are respectively individually fabricating by a conventional fabricating method.

For instance, the first chip 10A is roughly fabricated as follows:

A plurality of circuit elements not shown in the drawing are formed on a semiconductor wafer. Next, an insulating layer having contact holes is formed over the respective circuit elements. A conductive layer is formed inside the contact holes. Subsequently, an aluminum film containing silicon is deposited on the insulating layer by a sputtering method. Afterwards, the aluminum film is etched into predetermined shapes, so that such bonding pads 12 as shown in the drawing are formed.

Next, a passivation film made up of a silicon nitride film is formed over the insulating layer and bonding pads 12 by a CVD (Chemical Vapor Deposition) method. Thereafter, the passivation film positioned on a central area of each bonding pad 12 is removed by etching. Further, an interlayer insulating film composed of polyimide is formed over the passivation film and the bonding pads 12. The interlayer insulating film located on the central area of each bonding pad 12 is removed again by etching. Thereafter, the so-processed semiconductor wafer is heat-treated so that the interlayer insulating film is thermoset.

Next, a metal such as copper is sputtered on the bonding pads 12 and the interlayer insulating film, thereby forming a metal thin-film layer. Further, the metal thin-film layer is etched into predetermined shapes, after which their surfaces are subjected to copper electrolytic plating, whereby the redistributions 14 are formed.

Next, a resist film is formed over the interlayer insulating film and the redistributions 14, and only the resist film placed on the redistributions 14 where each of the ball pads 15 is formed, is removed. The copper-made ball pads 15 are respectively formed on the redistributions 14 by electrolytic plating. Further, the remaining resist films are removed.

Next, the entire semiconductor wafer is inserted into an encapsulation mold, which is filled with the sealing resin 16. Thus, the sealing resin 16 is formed on the front surface of the semiconductor wafer. Therefore, the circuit forming surface (a first major surface) of the semiconductor substrate 11, the bonding pads 12, the redistributions 14 and the ball pads 15 are covered with the sealing resin 16.

The semiconductor wafer given resin sealing is taken out from the encapsulating mold, and the surface of the sealing resin 16 is ground to expose the top surfaces of the ball pads 15. Further, the solder bumps 17 are formed on their corresponding top surfaces of the ball pads 15 by a screen printing method. Thereafter, the semiconductor wafer is cut into each individual semiconductor chips, whereby the first chip 10A is completed.

On the other hand, the second chip 20 is fabricated as follows:

A plurality of circuit elements not shown in the drawing are formed on the semiconductor wafer, an insulating layer having contact holes is formed over the respective circuit elements, and a conductive layer is formed inside the contact holes. Subsequently, an aluminum film containing silicon is deposited on the insulating layer. Further, the aluminum film is etched into predetermined shapes, so that such bonding pads 22 as shown in the drawing are formed. Thereafter, the semiconductor wafer is cut into each individual semiconductor chip, whereby the second chip 20 is completed.

The first chip 10A, the second chip 20 and the substrate 30 which are fabricated individually in this way are assembled as a semiconductor device in the following process steps.

Soldering flux is applied onto the chip mounting surface (a first major surface) of the substrate 30, and thereafter the first chip 10A is placed thereon so that the solder bumps 17 for their corresponding ball pads 15 are respectively placed on the bonding pads 32. The substrate 30 with the first chip 10A is inserted into a reflow furnace, where the solder bumps 17 is molten to connect the first chip 10A to the substrate 30. The substrate 30 with the first chip 10A mounted thereon is taken out from the reflow furnace, followed by cleaning of the flux.

Next, the back (a second major surface) of the first chip 10A and the back (a second major surface) of the second chip 20 are fixed back to back with the adhesive 42. Further, wire bonding process is carried out to the second chip 20 and the substrate 30, thus the bonding pads 22 provided on the surface (a first major surface) of the second chip 20 and their corresponding bonding pads 32 on the substrate 30 are wire bonded one another by the wires 43.

Next, the substrate 30 with the first chip 10A and the second chip 20 placed thereon is inserted into an encapsulating mold, which in turn is filled with the sealing resin 44. Thus, the chip mounting surface of the substrate 30, the first chip 10A, the second chip 20, and the wires 43 or the like are protected by being covered with the sealing resin 44. The resultant product is taken out from the encapsulating mold, and the solder bumps 35 are mounted on their corresponding ball pads 33 on the external connecting surface (a second major surface) of the substrate 30, whereby the semiconductor device is completed.

Since the semiconductor device according to the first embodiment uses the WCSP as the first chip 10A as described above, the first chip 10A and the substrate 30 are connected to each other by the solder bumps 17 of the WCSP. Thus, an advantage is obtained in that the need for the use of the adhesive in connection between the first chip 10A and the substrate 30 is eliminated and a semiconductor device having an MCP structure, which is excellent in moisture resistance and reflow resistance, can be obtained.

Second Preferred Embodiment

Figure 3:
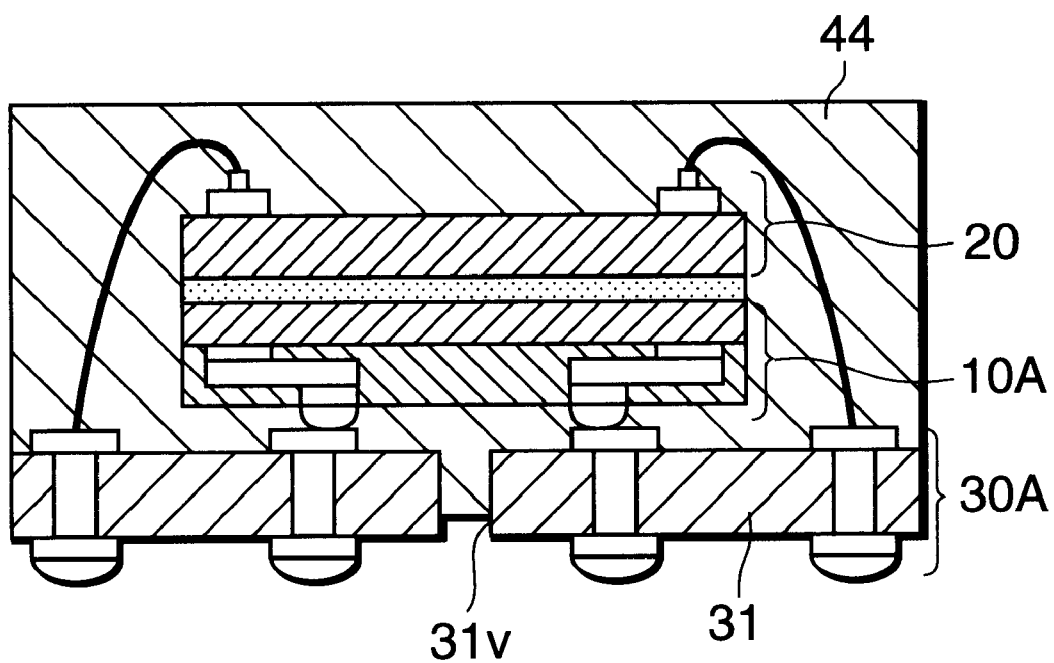
FIG. 3 is a cross-sectional view showing a semiconductor device according to a second preferred embodiment of the present invention.

FIG. 3 is a cross-sectional view showing a semiconductor device according to a second preferred embodiment of the present invention.

In the present semiconductor device, a substrate 30A slightly different in structure from the substrate 30 shown in FIG. 1 is provided as an alternative to the substrate 30 shown in FIG. 1. Namely, the substrate 30A has a through hole 31v defined in a central portion thereof, whereby a first chip 10A is mounted over the central portion of substrate 30 A. The present semiconductor device is similar to that shown in FIG. 1 in other structure.

Owing to such a structure, air lying between the substrate 30A and the first chip 10A is discharged outside through the through hole 31v when an sealing process step used for the fabrication of the semiconductor device is executed, i.e., the substrate 30A with the first chip 10A and a second chip 20 mounted thereon is inserted into an encapsulating mold and an sealing resin 44 is injected into the encapsulating mold. Thus, an advantage is brought about in that there is no possibility that air having failed to escape will produce voids with being left behind, and a problem about the breakage of the semiconductor device due to the expansion of air within the voids upon reflow can be avoided.

Third Preferred Embodiment

While the semiconductor devices according to the first and second embodiments are respectively provided with the solder bumps 17 on the ball pads 15 of the first chips as shown in FIGS. 1 and 3, a semiconductor device according to a third embodiment has a first chip of slightly different configuration from those the first chins 10A shown in FIGS. 1 and 2. Although not shown in the drawing, the first chip of the third embodiment is provided with gold-made bumps as an alternative to the solder bumps 17 on the ball pads 15. The gold-made bumps are respectively formed on the ball pads 15 by being subjected to electroless gold plating. The present embodiment is similar in other structure to the first or second embodiment.

When such a first chip is fixed to a chip mounting surface of a substrate 30, the first chip is mounted thereon such that the gold-made bumps for their corresponding ball pads 15 are located on their corresponding bonding pads 32 on the substrate 30, followed by heating to a predetermined temperature thereby to crimp it. The third embodiment is similar to the first or second embodiment in other assembly process steps.

Since the semiconductor device according to the third embodiment makes use of a WSCP as the first chip as described above, the first chip and the substrate 30 are connected to each other by the gold-made bumps of the WCSP. Thus, an advantage is obtained in addition to an advantage similar to the first or second embodiment in that since there is no solder bump-based connection, a flux coating process step and a cleaning process step for removing post-reflow flux become unnecessary, whereby a fabricating process can be simplified.

Incidentally, the present invention is not limited to the embodiments referred to above. Various modifications can be made. For example, the following are considered as such modifications.

(a) The materials or the like used for the respective portions are not limited to the illustrated materials.

(b) The structures of the first chips 10 and 10A and the second chip 20 are not limited to the illustrated ones.

(c) The fabricating method described in the first embodiment is one example and not limited to it.

According to one aspect of the present invention as described above in detail, a first chip fixed and connected to a substrate used for external connection is configured as follows:

The first chip has wirings which connects between an integrated circuit formed on the surface of the first chip and ball pads and which are sealed up with a first sealing resin, and connecting metal members which connects to a substrate and which are formed on the ball pads. Thus, it is not necessary to connect the substrate and the first chip to each other with an adhesive. Further, a second sealing resin seals up between the substrate and the first chip. Consequently, a semiconductor device of an MCP structure excellent in moisture resistance and reflow resistance can be obtained.

According to another aspect of the present invention, connecting metal members of a first chip are formed by electroless gold plating. Thus, since no solder is used upon mounting the first chip on a substrate, a flux coating process step and a cleaning process step for removing post-reflow flux become unnecessary. As a result, a fabricating process can be simplified.

According to still another aspect of the present invention, a through hole for causing a sealing resin to overflow is provided substantially in the center of a substrate over which a first chip is mounted. Owing to the provision thereof, there is no possibility that voids will be formed between the substrate and the first chip upon a sealing process step. Further, a problem about the breakage or the like of a semiconductor device due to the expansion of air within the voids upon reflow can be avoided.

According to still another aspect of the present invention, a first sealing resin is provided between a first chip and a substrate. Consequently, a semiconductor device of an MCP structure excellent in moisture resistance and reflow resistance can be obtained.

According to yet still another aspect of the present invention, a first chip makes use of one that functions as a package per se. Thus, it is not necessary to newly develop a first chip for the purpose of an MCP structure. Hence the already-formed one can be utilized as it is.

While the preferred form of the present invention has been described, it is to be understood that modifications will be apparent to those skilled in the art without departing from the spirit of the invention. The scope of the invention is to be determined solely by the following claims.

What is claimed is:

1. A semiconductor device comprising:
   a first chip including a first semiconductor substrate having a first major surface on which a first integrated circuit is formed and a second major surface; and
   a second chip including a second semiconductor substrate having a third major surface on which a second integrated circuit is formed and a fourth major surface;
   wherein said first chip is flip-chip connected onto a base substrate, the fourth major surface of the second semiconductor substrate being mounted on the second major surface of the first semiconductor substrate, and said first and second chips being sealed with a first sealing resin;
   wherein said first chip comprising,
      ball pads;
      connecting members formed on the ball pads and connected to the base substrate;
      wirings which connect between the first integrated circuit and the ball pads; and
      a second sealing resin which seals the first major surface of the first semiconductor substrates, the wirings, and surfaces of the ball pads, except for the connecting members and contact portions between the ball pads and the connecting members.

2. The semiconductor device according to claim 1, wherein the connecting members are formed by electroless gold plating.

3. The semiconductor device according to claim 1, wherein the base substrate has a through hole devoid of conductive material at a region under said first chip.

4. The semiconductor device according to claim 3, wherein the through hole is positioned at a substantially central region of the base substrate.

5. The semiconductor device according to claim 1, wherein the first sealing resin is provided between said first chip and the base substrate.

6. The semiconductor device according to claim 1, wherein said first chip functions as a package singly.

7. A semiconductor device comprising:
   a package substrate which has first and second major surfaces, first and second electrode pads formed on the first major surface, and first external terminals formed on the second major surface and electrically connected to corresponding ones of the first and second electrode pads;
   a first semiconductor chip which has third and fourth major surfaces, third electrode pads formed on the third major surface, second external terminals, has conductive members electrically connected to corresponding ones of the second external terminals and the third electrode pads, and a first sealing resin sealing the third major surface and the conductive members except for the second external terminals and contact portions between the second external terminals and the conductive members, the second external terminals being connected to the corresponding first electrode pads;
   a second semiconductor chip which has a fifth major surface mounted over the fourth major surface, a sixth major surface, and fourth electrode pads formed on the sixth major surface;
   bonding wires which connect the fourth electrode pads and the second electrode pads; and
   a second sealing resin which seals the bonding wires, the second electrode pads, and the first and second semiconductor chips.

8. The semiconductor device according to claim 7, wherein the first external terminals are solder balls.

9. The semiconductor device according to claim 7, wherein the first external terminals are formed by electroless gold plating.

10. The semiconductor device according to claim 7, wherein the package substrate has a through hole devoid of conductive material at a region under the first semiconductor chip.

11. The semiconductor device according to claim 10, wherein the through hole is positioned at a substantially central region of the package substrate.

12. The semiconductor device according to claim 7, wherein the second sealing resin is provided between the first semiconductor chip and the package substrate.

13. The semiconductor device according to claim 7, wherein the first semiconductor chip functions as a package singly.

14. The semiconductor device according to claim 7, wherein the conductive members are made of copper.

15. The semiconductor device according to claim 7, wherein the second external terminals are solder balls.

16. A semiconductor device comprising:
   a base substrate which has first and second surfaces, first and second electrode pads formed on the first surface, and first external terminals formed on the second surface and electrically connected to corresponding ones of the first and second electrode pads via through holes extending from the first surface to the second surface;
   a first chip which has third and fourth surfaces, third electrode pads formed on the third surface, second external terminals, conductive members electrically connected to corresponding ones of the second external terminals and the third electrode pads, and a first sealing resin sealing the third surface and the conductive members except for the second external terminals and contact portions between the second external terminals and the conductive members, the second external terminals being connected to the corresponding first electrode pads;

a second chip which has a fifth surface mounted over the fourth surface, a sixth surface, and fourth electrode pads formed on the sixth surface;

bonding wires which connect the fourth electrode pads and the second electrode pads; and a second sealing resin which seals the bonding wires, the second electrode pads, and the first and second chips.

17. The semiconductor device according to claim 16, wherein the base substrate has a through hole devoid of conductive material at a region under the first chip.

18. The semiconductor device according to claim 17, wherein the through hole is positioned at a substantially central region of the base substrate.

19. The semiconductor device according to claim 16, wherein the second sealing resin is provided between the first chip and the base substrate.

20. The semiconductor device according to claim 16, wherein the first chip functions as a package singly.

* * * * *